United States Patent
Chen et al.

(10) Patent No.: US 12,312,275 B2
(45) Date of Patent: May 27, 2025

(54) LTCC MICROWAVE DIELECTRIC MATERIAL AND PREPARATION METHOD THEREOF

(71) Applicant: GUANGDONG FENGHUA ADVANCED TECHNOLOGY HOLDING CO., LTD., Guangdong (CN)

(72) Inventors: Tao Chen, Guangdong (CN); Kai Cheng, Guangdong (CN); Xiuhua Cao, Guangdong (CN); Shiwo Ta, Guangdong (CN); Zhenxiao Fu, Guangdong (CN)

(73) Assignee: GUANGDONG FENGHUA ADVANCED TECHNOLOGY HOLDING CO., LTD., Zhaoqing (CN)

( * ) Notice: Subject to any disclaimer, the term of this patent is extended or adjusted under 35 U.S.C. 154(b) by 972 days.

(21) Appl. No.: 17/389,334

(22) Filed: Jul. 29, 2021

(65) Prior Publication Data
US 2021/0355035 A1 Nov. 18, 2021

Related U.S. Application Data

(63) Continuation of application No. PCT/CN2021/078758, filed on Mar. 2, 2021.

(30) Foreign Application Priority Data

Mar. 17, 2020 (CN) .......................... 202010188993.5

(51) Int. Cl.
C04B 35/495 (2006.01)
C04B 35/626 (2006.01)
C04B 111/90 (2006.01)

(52) U.S. Cl.
CPC ........ *C04B 35/495* (2013.01); *C04B 35/6261* (2013.01); *C04B 2111/90* (2013.01); *C04B 2235/3206* (2013.01); *C04B 2235/3208* (2013.01); *C04B 2235/3213* (2013.01); *C04B 2235/3215* (2013.01); *C04B 2235/3258* (2013.01); *C04B 2235/365* (2013.01)

(58) Field of Classification Search
CPC .............. C04B 35/495; C04B 35/6261; C04B 2111/90; C04B 2235/3201; C04B 2235/3203; C04B 35/62685; C04B 35/16; C04B 2235/3206; C04B 2235/3208; C04B 2235/3213; C04B 2235/3215; C01P 2006/40; C01G 41/00; C09K 11/621; H01B 3/12; H05K 1/0306
See application file for complete search history.

(56) References Cited

FOREIGN PATENT DOCUMENTS

| CN | 101538159 A | | 9/2009 | | |
|---|---|---|---|---|---|
| CN | 106699178 A | * | 5/2017 | ........... | C04B 35/495 |
| KR | 100638888 B1 | * | 10/2006 | ........... | C04B 35/495 |

OTHER PUBLICATIONS

Khalf et al., "Influence of barium borosilicate glass on microstructure and dielectric properties of (Ba, Ca)(Zr, Ti)O3 ceramics," J. of the European Ceramic Society 38 (2018), 4422-4432. (Year: 2018).*
Lei et al., "Controllable tf value of barium silicate microwave dielectric ceramics with different Ba/Si ratios," J. American Ceramic Society 101 (2018), 25-30. (Year: 2018).*
Rangappa et al., "Preparation of Ba1-xSrxWO4 and Ba1-xCaxWO4 films on tungsten plate by mechanically assisted solution reaction at room temperature," Materials Chemistry and Physics 109 (2008): 217-223 (Year: 2008).*
Khobragade et al., "Structural, optical and microwave dielectric properties of Sr1-xCaxWO4 ceramics prepared by the solid state reaction route," Ceramics International 39 (2013): 9627-9635 (Year: 2013).*
Machine Translation of CN 106699178 A (Year: 2017).*
Machine Translation of KR 100638888 B1 (Year: 2006).*
Priya et al., "Structural, optical and microwave dielectric properties of Ba1-XSrXW04 ceramics prepared by solid state reaction route," Solid State Sciences 20 (2013), pp. 40-45. (Year: 2013).*
Wen Lei et al., Controllable Tf value of barium silicate microwave dielectric ceramics with different Ba/Si ratios, Journal of the American Ceramic Society, Jan. 31, 2018, pp. 25-30, vol. 101, No. 1.

* cited by examiner

*Primary Examiner* — Bryan D. Ripa
*Assistant Examiner* — Paul Alan Forsyth

(57) ABSTRACT

An LTCC microwave dielectric material, including the following components: a $Ba_5Si_8O_{21}$+(1−a) $(Mg_xCa_ySr_zBa_{1-x-y-z})WO_4$+Ba—B—Si glass; wherein $0.4 \leq a \leq 0.8$, $0 \leq x \leq 1$, $0 \leq y \leq 1$, $0 \leq z \leq 1$. By adjusting the amounts of $Ba_5Si_8O_{21}$ and $(Mg_xCa_ySr_zBa_{1-x-y-z})WO_4$, the temperature coefficient of resonance frequency can be adjusted to nearly zero. The material is suitable for the fields of high-frequency communication and radiofrequency. Also disclosed is a method for preparing the LTCC microwave dielectric material.

14 Claims, No Drawings

LTCC MICROWAVE DIELECTRIC MATERIAL AND PREPARATION METHOD THEREOF

CROSS REFERENCE TO RELATED APPLICATIONS

The present application is a Continuation Application of PCT Application No. PCT/CN2021/078758 filed on Mar. 2, 2021, which claims the benefit of Chinese Patent Application No. 202010188993.5 filed on Mar. 17, 2020. All the above are hereby incorporated by reference in their entirety.

FIELD OF THE DISCLOSURE

This disclosure belongs to the field of microwave dielectric materials and specifically relates to an LTCC microwave dielectric material with a temperature coefficient of resonance frequency close to zero, and a preparation method thereof.

BACKGROUND OF THE DISCLOSURE

With the development of 5G communications and the Internet of Things, high-frequency applications have become a trend. The typical characteristics of 5G communication devices are miniaturization, high integration, and high reliability. Low-temperature co-fired ceramic materials (LTCC), a key dielectric material for 5G communication device integration, has become a research hotspot. To reduce signal transmission loss and speed up signal transmission, LTCC materials need to have a low dielectric constant and a high Q value (i.e., low loss). To improve the stability of signal transmission, the materials need to have a near-zero temperature coefficient of resonance frequency.

In Chinese patent application No. CN 200910113981.X, $Ba_{5-x}La_xTi_xNb_xO_{15}$ is complexed with $BaCuB_2O_5$ and $BaWO_4$ to obtain a low-temperature firing microwave dielectric ceramic with Qf value of higher than 10000 GHz and a near-zero temperature coefficient of resonance frequency. However, because $Ba_{5-x}La_xTi_xNb_xO_{15}$ has a high dielectric constant, the dielectric constant of the system is also high (35-45), which is undesirable. For this reason, it is necessary to develop a new composite material system for the preparation of an LTCC microwave dielectric ceramic with a low dielectric constant and a near-zero temperature coefficient of resonance frequency.

SUMMARY OF THE DISCLOSURE

The objective of the present disclosure is to provide an LTCC microwave dielectric material with a near-zero temperature coefficient of resonance frequency to overcome the drawbacks of the prior art discussed above.

The technical solutions of the present disclosure are as follows:

An LTCC microwave dielectric material, comprising the following components: a $Ba_5Si_8O_{21}$+(1−a) $(Mg_xCa_ySr_zBa_{1-x-y-z})WO_4$+Ba—B—Si glass; wherein $0.4 \leq a \leq 0.8$, $0 \leq x \leq 1$, $0 \leq y \leq 1$, $0 \leq z \leq 1$.

In the present disclosure, $Ba_5Si_8O_{21}$, having a positive temperature coefficient of resonance frequency and a low dielectric constant, complexes with $(Mg_xCa_ySr_zBa_{1-x-y-z})WO_4$, which has a negative temperature coefficient of resonance frequency. The sintering temperature of the system is lowered by the addition of Ba—B—Si glass, which has a low melting point. The LTCC microwave dielectric ceramic obtained has a low dielectric constant and a near-zero temperature coefficient of resonance frequency, and is suitable for applications in the fields of high-frequency communication and radiofrequency.

Preferably, a weight of the Ba—B—Si glass is 2-15% of a total weight of $Ba_5Si_8O_{21}$ and $(Mg_xCa_ySr_zBa_{1-x-y-z})WO_4$. This better reduces the sintering temperature of the system.

The present disclosure also provides a method for preparing the LTCC microwave dielectric material, comprising the following steps:

(1) Weighing raw materials according to a stoichiometric ratio of $Ba_5Si_8O_{21}$; transferring the raw materials weighed, zirconia balls, and deionized water into a ball mill pot; ball-milling for 4-12 h, removing a ball-milling product from the ball mill pot, followed by drying and sieving to obtain a powder; calcinating the powder at 1100-1250° C., holding the temperature for 1-5 h before cooling the powder to room temperature to obtain $Ba_5Si_8O_{21}$ powder;

(2) Weighing raw materials according to a stoichiometric ratio of $(Mg_xCa_ySr_zBa_{1-x-y-z})WO_4$; transferring the raw materials weighed, zirconia balls, and deionized water into a ball mill pot; planetary ball-milling for 4-12 h, removing a ball-milling product from the ball mill pot, followed by drying and sieving to obtain a powder; calcinating the powder at 700-1000° C., holding the temperature for 1-5 h before cooling the powder to room temperature to obtain $(Mg_xCa_ySr_zBa_{1-x-y-z})WO_4$ powder;

(3) Putting the Ba—B—Si glass, zirconia balls, and deionized water into a ball mill pot, ball-milling for 2-6 h; removing a ball-milling product from the ball mill pot, followed by drying to obtain Ba—B—Si glass powder;

(4) Putting the $Ba_5Si_8O_{21}$ powder obtained in step (1), the $(Mg_xCa_ySr_zBa_{1-x-y-z})WO_4$ powder obtained in step (2), the Ba—B—Si glass powder obtained in step (3), zirconia balls, and deionized water into a ball mill pot, ball-milling for 2-6 h; removing a ball-milling product from the ball mill pot, followed by drying and powdering to obtain a ceramic powder for preparing an LTCC microwave dielectric ceramic;

(5) Adding a PVA solution to the ceramic powder obtained in step (4) to granulate, followed by pressing to form a cylindrical block; sintering the cylindrical block at 850-900° C., holding the temperature for 0.5-3 h to obtain the LTCC microwave dielectric ceramic.

Preferably, the Ba—B—Si glass of step (3) is prepared by the steps of:

Transferring weighed raw materials, zirconia balls, and deionized water into a ball mill pot, the raw materials consist of $SiO_2$, $H_3BO_3$, $BaCO_3$, $Na_2CO_3$, $Li_2CO_3$, $CaCO_3$, $SrCO_3$, $K_2CO_3$, $Al_2O_3$, $MgO$, and $TiO_2$; planetary ball-milling for 1-4 h; removing a ball-milling product from the ball mill pot, followed by drying to obtain a dried powder; melting the dried powder at 1200-1500° C., holding the temperature for 1-3 h to obtain a high-temperature glass liquid, pouring the high-temperature glass liquid into deionized water to quench to obtain the Ba—B—Si glass.

In the preparation method of this disclosure, $Ba_5Si_8O_{21}$ with a positive temperature coefficient of resonance frequency ($\tau f$) and $AWO_4$ with a negative $\tau f$ (A can be at least one or a combination of alkaline earth metal elements) are prepared by solid-state reactions. The Ba—B—Si (BBS) glass with a low melting point is prepared by a melting method. By controlling the amount of $Ba_5Si_8O_{21}$ and $AWO_4$, $\tau f$ can be adjusted to near-zero. The BBS glass reduces the sintering temperature of the system to below 900° C. As a result, an LTCC microwave dielectric ceramic with a near-zero τf and a low dielectric constant can is obtained.

Preferably, the sieving in steps (1) and (2) is sieving through a 200-mesh sieve.

Preferably, in step (5), a weight of the PVA solution is 7-10 wt % of a weight of the ceramic powder.

Preferably, the raw materials of step (2) are MgO, $CaCO_3$, $SrCO_3$, $BaCO_3$, and $WO_3$.

Preferably, the raw materials of step (1) are $BaCO_3$ and $SiO_2$.

Compared with the prior art, the beneficial effects of the present disclosure are:

The raw materials used in this application are prepared by solid-state reactions. These reactions have a simple process and are therefore suitable for an industrial setting. $Ba_5Si_8O_{21}$, $(Mg_xCa_ySr_zBa_{1-x-y-z})WO_4$, and Ba—B—Si glass have low dielectric constants, thus the LTCC microwave dielectric ceramic obtained after complexation also has a low dielectric constant. By adjusting the amounts of $Ba_5Si_8O_{21}$ and $(Mg_xCa_ySr_zBa_{1-x-y-z})WO_4$, the temperature coefficient of resonance frequency can be adjusted to nearly zero. The material is thus suitable for the fields of high-frequency communication and radiofrequency.

DETAILED DESCRIPTION OF EMBODIMENTS

The objectives, technical solutions, and beneficial effects of the present disclosure will be described below with reference to the embodiments.

The LTCC microwave dielectric materials of the embodiments comprise the following components: a $Ba_5Si_8O_{21}$+(1−a) $(Mg_xCa_ySr_zBa_{1-x-y-z})WO_4$+Ba—B—Si glass; wherein $0.4 \leq a \leq 0.8$, $0 \leq x \leq 1$, $0 \leq y \leq 1$, $0 \leq z \leq 1$. The weight of the Ba—B—Si glass is 2-15% (b %) of the total weight of $Ba_5Si_8O_{21}$ and $(Mg_xCa_ySr_zBa_{1-x-y-z})WO_4$.

The method for preparing the LTCC microwave dielectric materials of the embodiments comprises the following steps:

(1) Weighing raw materials ($BaCO_3$ and $SiO_2$) according to the stoichiometric ratio of $Ba_5Si_8O_{21}$; transferring the raw materials weighed, zirconia balls, and deionized water into a ball mill pot; planetary ball-milling for 4-12 h, removing the ball-milling product from the ball mill pot, followed by drying and sieving through a 200-mesh sieve to obtain a powder; calcinating the powder in an alumina crucible in a muffle furnace at 1100-1250° C., holding the temperature for 1-5 h before cooling the powder to room temperature to obtain $Ba_5Si_8O_{21}$ powder.

(2) Weighing raw materials (MgO, $CaCO_3$, $SrCO_3$, $BaCO_3$, and $WO_3$) according to the stoichiometric ratio of $(Mg_xCa_ySr_zBa_{1-x-y-z})WO_4$ ($0 \leq x \leq 1$, $0 \leq y \leq 1$, $0 \leq z \leq 1$); transferring the raw materials weighed, zirconia balls, and deionized water into a ball mill pot; planetary ball-milling for 4-12 h; removing the ball-milling product from the ball mill pot, followed by drying and sieving through a 200-mesh sieve to obtain a powder; calcinating the powder in a muffle furnace at 700-1000° C., holding the temperature for 1-5 h before cooling the powder to room temperature to obtain $(Mg_xCa_ySr_zBa_{1-x-y-z})WO_4$ powder.

(3) Transferring weighed raw materials (45.8 wt % $SiO_2$, 39.6 wt % $H_3BO_3$, 5.3 wt % $BaCO_3$, 1.6 wt % $Na_2CO_3$, 0.7 wt % $Li_2CO_3$, 1.5 wt % $CaCO_3$, 1.1 wt % $SrCO_3$, 1.9 wt % $K_2CO_3$, 1.2 wt % $Al_2O_3$, 0.8 wt % MgO, 0.5 wt % $TiO_2$), zirconia balls, and deionized water into a ball mill pot; planetary ball-milling for 1-4 h; removing the ball-milling product from the ball mill pot, followed by drying to obtain a dried powder; melting the dried powder in an alumina crucible in a high-temperature furnace at 1200-1500° C., holding the temperature for 1-3 h to obtain a high-temperature glass liquid, pouring the high-temperature glass liquid into deionized water to quench to obtain a Ba—B—Si glass. Putting the Ba—B—Si glass, zirconia balls, and deionized water into a ball mill pot, planetary ball-milling for 2-6 h; removing the ball-milling product from the ball mill pot, followed by drying to obtain Ba—B—Si glass powder.

(4) Weighing the $Ba_5Si_8O_{21}$ powder, the $(Mg_xCa_ySr_zBa_{1-x-y-z})WO_4$ powder, and the Ba—B—Si glass powder described above according to the ratio specified by a $Ba_5Si_8O_{21}$+(1−a) $(Mg_xCa_ySr_zBa_{1-x-y-z})WO_4$+b wt % Ba—B—Si glass; wherein $0.4 \leq a \leq 0.8$, $2 \leq b \leq 15$. Putting the weighed powder mixture, zirconia balls, and deionized water into a ball mill pot, planetary ball-milling for 2-6 h; removing the ball-milling product from the ball mill pot, followed by drying and smashing to obtain a ceramic powder for preparing an LTCC microwave dielectric ceramic.

(5) Adding 7-10 wt % of a PVA solution to the ceramic powder to granulate, followed by pressing to form a cylindrical block; sintering the cylindrical block at 850-900° C., holding the temperature for 0.5-3 h to obtain the LTCC microwave dielectric ceramic.

The components and properties of the LTCC microwave dielectric materials of the embodiments are shown in Table 1. The dielectric constant and the Qf value are obtained by a parallel-plate reflection method with a network analyzer. τf value is calculated by the formula $$\tau f = \frac{f2 - f1}{f1 \cdot (T2 - T1)},$$

wherein T2 and T1 are 80° C. and 25° C. respectively, f2 and f1 are the resonance frequencies of the sample at temperatures T2 and T1 respectively.

TABLE 1

Components and Microwave Dielectric Properties of Embodiments

| Embodiment | x | y | z | a | b | Sintering temperature (° C.) | Dielectric constant | Qf value (GHz) | τf (ppm/° C.) |
|---|---|---|---|---|---|---|---|---|---|
| 1 | 1 | 0 | 0 | 0.6 | 2 | 900 | 9.7 | 18700 | −8.9 |
| 2 | 0 | 1 | 0 | 0.5 | 7 | 860 | 8.9 | 24300 | −1.3 |
| 3 | 0 | 0 | 1 | 0.6 | 8 | 880 | 8.3 | 17400 | −3.2 |
| 4 | 0 | 0 | 1 | 0.7 | 6 | 880 | 7.8 | 16600 | +4.1 |

TABLE 1-continued

Components and Microwave Dielectric Properties of Embodiments

| Embodiment | x | y | z | a | b | Sintering temperature (° C.) | Dielectric constant | Qf value (GHz) | τf (ppm/° C.) |
|---|---|---|---|---|---|---|---|---|---|
| 5 | 0 | 0 | 0 | 0.8 | 15 | 850 | 6.5 | 12000 | +1.6 |
| 6 | 0 | 0.5 | 0 | 0.5 | 9 | 870 | 7.3 | 17800 | +6.7 |
| 7 | 0.5 | 0 | 0.5 | 0.7 | 12 | 850 | 6.9 | 15800 | −2.9 |

According to Table 1, the LTCC microwave dielectric ceramics obtained in this disclosure have relatively low dielectric constants. By adjusting the amounts of $Ba_5Si_8O_{21}$ and $(Mg_xCa_ySr_zBa_{1-x-y-z})WO_4$, the temperature coefficient of resonance frequency can be adjusted to nearly zero. The material is thus suitable for the fields of high-frequency communication and radiofrequency.

Finally, it should be noted that the embodiments are only used to illustrate the technical solutions of the present disclosure. They do not intend to limit the protection scope of the present disclosure. Although the present disclosure has been described in detail with reference to the preferred embodiments, those of ordinary skill in the art should understand that the technical solutions of the present disclosure can be modified without departing from the spirit and the scope of the present disclosure.

What is claimed is:

1. An LTCC microwave dielectric material, comprising the following components: a $Ba_5Si_8O_{21}$+(1−a) $(Mg_xCa_ySr_zBa_{1-x-y-z})WO_4$+Ba—B—Si glass; wherein $0.4 \leq a \leq 0.8$, $0 \leq x \leq 1$, $0 \leq y \leq 1$, $0 \leq z \leq 1$, and $1-x-y-z \neq 1$.

2. The LTCC microwave dielectric material according to claim 1, wherein a weight of the Ba—B—Si glass is 2-15% of a total weight of $Ba_5Si_8O_{21}$ and $(Mg_xCa_ySr_zBa_{1-x-y-z})WO_4$.

3. A method for preparing the LTCC microwave dielectric material according to claim 1, comprising the following steps:
   (1) weighing raw materials according to a stoichiometric ratio of $Ba_5Si_8O_{21}$; transferring the raw materials weighed, zirconia balls, and deionized water into a ball mill pot; ball-milling for 4-12 h, removing a ball-milling product from the ball mill pot, followed by drying and sieving to obtain a powder; calcinating the powder at 1100-1250° C., holding the temperature for 1-5 h before cooling the powder to room temperature to obtain $Ba_5Si_8O_{21}$ powder;
   (2) weighing raw materials according to a stoichiometric ratio of $(Mg_xCa_ySr_zBa_{1-x-y-z})WO_4$; transferring the raw materials weighed, zirconia balls, and deionized water into a ball mill pot; planetary ball-milling for 4-12 h, removing a ball-milling product from the ball mill pot, followed by drying and sieving to obtain a powder; calcinating the powder at 700-1000° C., holding the temperature for 1-5 h before cooling the powder to room temperature to obtain $(Mg_xCa_ySr_zBa_{1-x-y-z})WO_4$ powder;
   (3) putting the Ba—B—Si glass, zirconia balls, and deionized water into a ball mill pot, ball-milling for 2-6 h; removing a ball-milling product from the ball mill pot, followed by drying to obtain Ba—B—Si glass powder;
   (4) putting the $Ba_5Si_8O_{21}$ powder obtained in step (1), the $(Mg_xCa_ySr_zBa_{1-x-y-z})WO_4$ powder obtained in step (2), the Ba—B—Si glass powder obtained in step (3), zirconia balls, and deionized water into a ball mill pot, ball-milling for 2-6 h; removing a ball-milling product from the ball mill pot, followed by drying and smashing to obtain a ceramic powder for preparing an LTCC microwave dielectric ceramic;
   (5) adding a PVA solution to the ceramic powder obtained in step (4) to granulate, followed by pressing to form a cylindrical block; sintering the cylindrical block at 850-900° C., holding the temperature for 0.5-3 h to obtain the LTCC microwave dielectric ceramic.

4. The method according to claim 3, wherein the Ba—B—Si glass of step (3) is prepared by the steps of
   transferring weighed raw materials, zirconia balls, and deionized water into a ball mill pot, the raw materials consist of $SiO_2$, $H_3BO_3$, $BaCO_3$, $Na_2CO_3$, $Li_2CO_3$, $CaCO_3$, $SrCO_3$, $K_2CO_3$, $Al_2O_3$, MgO, and $TiO_2$; planetary ball-milling for 1-4 h; removing a ball-milling product from the ball mill pot, followed by drying to obtain a dried powder; melting the dried powder at 1200-1500° C., holding the temperature for 1-3 h to obtain a high-temperature glass liquid, pouring the high-temperature glass liquid into deionized water to quench to obtain the Ba—B—Si glass.

5. The method according to claim 3, wherein the sieving in steps (1) and (2) is sieving through a 200-mesh sieve.

6. The method according to claim 3, wherein in step (5), a weight of the PVA solution is 7-10 wt % of a weight of the ceramic powder.

7. The method according to claim 3, wherein the raw materials of step (2) are MgO, $CaCO_3$, $SrCO_3$, $BaCO_3$, and $WO_3$.

8. The method according to claim 3, wherein the raw materials of step (1) are $BaCO_3$ and $SiO_2$.

9. A method for preparing the LTCC microwave dielectric material according to claim 2, comprising the following steps:
   (1) weighing raw materials according to a stoichiometric ratio of $Ba_5Si_8O_{21}$; transferring the raw materials weighed, zirconia balls, and deionized water into a ball mill pot; ball-milling for 4-12 h, removing a ball-milling product from the ball mill pot, followed by drying and sieving to obtain a powder; calcinating the powder at 1100-1250° C., holding the temperature for 1-5 h before cooling the powder to room temperature to obtain $Ba_5Si_8O_{21}$ powder;
   (2) weighing raw materials according to a stoichiometric ratio of $(Mg_xCa_ySr_zBa_{1-x-y-z})WO_4$; transferring the raw materials weighed, zirconia balls, and deionized water into a ball mill pot; planetary ball-milling for 4-12 h, removing a ball-milling product from the ball mill pot, followed by drying and sieving to obtain a powder; calcinating the powder at 700-1000° C., holding the temperature for 1-5 h before cooling the powder to room temperature to obtain $(Mg_xCa_ySr_zBa_{1-x-y-z})WO_4$ powder;

(3) putting the Ba—B—Si glass, zirconia balls, and deionized water into a ball mill pot, ball-milling for 2-6 h; removing a ball-milling product from the ball mill pot, followed by drying to obtain Ba—B—Si glass powder;

(4) putting the $Ba_5Si_8O_{21}$ powder obtained in step (1), the $(Mg_xCa_ySr_zBa_{1-x-y-z})WO_4$ powder obtained in step (2), the Ba—B—Si glass powder obtained in step (3), zirconia balls, and deionized water into a ball mill pot, ball-milling for 2-6 h; removing a ball-milling product from the ball mill pot, followed by drying and smashing to obtain a ceramic powder for preparing an LTCC microwave dielectric ceramic;

(5) adding a PVA solution to the ceramic powder obtained in step (4) to granulate, followed by pressing to form a cylindrical block; sintering the cylindrical block at 850-900° C., holding the temperature for 0.5-3 h to obtain the LTCC microwave dielectric ceramic.

10. The method according to claim 9, wherein the Ba—B—Si glass of step (3) is prepared by the steps of transferring weighed raw materials, zirconia balls, and deionized water into a ball mill pot, the raw materials consist of $SiO_2$, $H_3BO_3$, $BaCO_3$, $Na_2CO_3$, $Li_2CO_3$, $CaCO_3$, $SrCO_3$, $K_2CO_3$, $Al_2O_3$, MgO, and $TiO_2$; planetary ball-milling for 1-4 h; removing a ball-milling product from the ball mill pot, followed by drying to obtain a dried powder; melting the dried powder at 1200-1500° C., holding the temperature for 1-3 h to obtain a high-temperature glass liquid, pouring the high-temperature glass liquid into deionized water to quench to obtain the Ba—B—Si glass.

11. The method according to claim 9, wherein the sieving in steps (1) and (2) is sieving through a 200-mesh sieve.

12. The method according to claim 9, wherein in step (5), a weight of the PVA solution is 7-10 wt % of a weight of the ceramic powder.

13. The method according to claim 9, wherein the raw materials of step (2) are MgO, $CaCO_3$, $SrCO_3$, $BaCO_3$, and $WO_3$.

14. The method according to claim 9, wherein the raw materials of step (1) are $BaCO_3$ and $SiO_2$.

* * * * *